(12) United States Patent
Chen et al.

(10) Patent No.: US 10,687,413 B2
(45) Date of Patent: Jun. 16, 2020

(54) MOTOR DRIVING DEVICE

(71) Applicant: FANUC CORPORATION, Yamanashi (JP)

(72) Inventors: Jianzhou Chen, Yamanashi-ken (JP);
Naoki Masuda, Yamanashi-ken (JP);
Shinichi Mizukami, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/297,813

(22) Filed: Mar. 11, 2019

(65) Prior Publication Data
US 2019/0281694 A1    Sep. 12, 2019

(30) Foreign Application Priority Data
Mar. 12, 2018  (JP) ................................ 2018-043858

(51) Int. Cl.
| H05K 7/00 | (2006.01) |
| H05K 1/02 | (2006.01) |
| H02M 5/458 | (2006.01) |
| H05K 7/20 | (2006.01) |
| H02P 27/06 | (2006.01) |

(Continued)

(52) U.S. Cl.
CPC ........ *H05K 1/0209* (2013.01); *H02M 5/4585* (2013.01); *H02P 27/06* (2013.01); *H05K 1/14* (2013.01); *H05K 7/20909* (2013.01); *H02M 7/003* (2013.01)

(58) Field of Classification Search
None
See application file for complete search history.

(56) References Cited

U.S. PATENT DOCUMENTS 5,699,235 A * 12/1997 Tsurumiya ........... H05K 1/0265
361/736
6,501,662 B2 * 12/2002 Ikeda .................... H02M 7/003
174/252

(Continued)

FOREIGN PATENT DOCUMENTS

| JP | 4131964 U | 12/1992 |
| JP | 5259373 A | 10/1993 |

(Continued)

OTHER PUBLICATIONS

English Abstract and Machine Translation for Japanese Publication No. 05-259373 A, published Oct. 8, 1993, 5 pgs.

(Continued)

*Primary Examiner* — Courtney L Smith
(74) *Attorney, Agent, or Firm* — Fredrikson & Byron, P.A.

(57) ABSTRACT

A motor driving device includes a control circuit board provided with a control circuit configured to output a control signal of a secondary voltage and a power circuit board provided with power circuitry to which a primary voltage higher than the secondary voltage is applied. The power circuit board includes a first substrate provided with a primary voltage component group to which only the primary voltage is applied, and a second substrate provided with a converter component group configured to convert the primary voltage into the secondary voltage and convert the secondary voltage into the primary voltage.

9 Claims, 1 Drawing Sheet

(51) Int. Cl.
*H05K 1/14* (2006.01)
*H02M 7/00* (2006.01)

(56) References Cited

U.S. PATENT DOCUMENTS

| | | | | |
|---|---|---|---|---|
| 7,280,365 | B2 * | 10/2007 | Belson | H05K 1/141 |
| | | | | 165/80.3 |
| 8,164,904 | B2 * | 4/2012 | Matz | H01L 25/0657 |
| | | | | 174/252 |
| 2010/0219785 | A1 * | 9/2010 | Hirose | H01L 27/0658 |
| | | | | 318/519 |
| 2015/0155816 | A1 * | 6/2015 | Saito | H02P 5/74 |
| | | | | 318/139 |
| 2016/0105986 | A1 * | 4/2016 | Ledezma | H02M 7/003 |
| | | | | 361/730 |
| 2018/0287466 | A1 * | 10/2018 | Kim | H02P 27/06 |

FOREIGN PATENT DOCUMENTS

| | | |
|---|---|---|
| JP | 846317 A | 2/1996 |
| JP | 2009130967 A | 6/2009 |
| JP | 3171146 U | 10/2011 |

OTHER PUBLICATIONS

English Abstract and Machine Translation for Japanese Publication No. 3171146 U, published Oct. 20, 2011, 25 pgs.
English Machine Translation for Japanese Publication No. 04-131964 U, published Dec. 4, 1992, 7 pgs.
English Abstract for Japanese Publication No. JPH0846317 A, published Feb. 16, 1996, 2 pgs.
English Machine Translation for Japanese Publication No. JP2009-130967 A, published Jun. 11, 2009, 14 pgs.

* cited by examiner

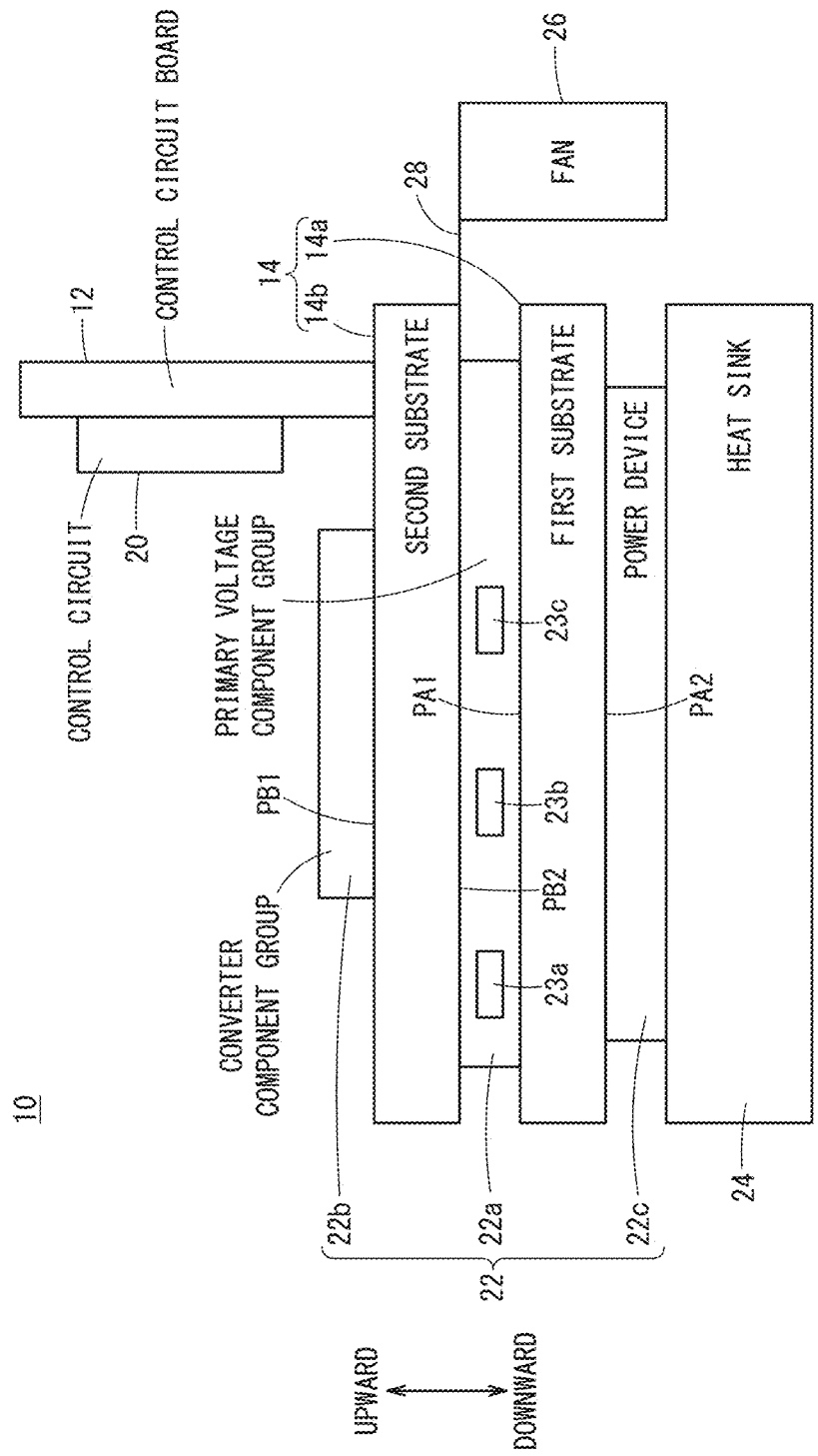

MOTOR DRIVING DEVICE

CROSS-REFERENCE TO RELATED APPLICATION

This application is based upon and claims the benefit of priority from Japanese Patent Application No. 2018-043858 filed on Mar. 12, 2018, the contents of which are incorporated herein by reference.

BACKGROUND OF THE INVENTION

Field of the Invention

The present invention relates to a motor driving device for driving a motor.

Description of the Related Art

Japanese Laid-Open Patent Publication No. 05-259373 discloses a power semiconductor device which suppresses malfunction of a control circuit caused by switching operation of a power chip or the like. Specifically, Japanese Laid-Open Patent Publication No. 05-259373 discloses that a circuit board is partitioned into two sections, i.e., a control circuit board with electronic components for control circuitry mounted thereon and a power circuit board with power chips mounted thereon.

SUMMARY OF THE INVENTION

Here, among the multiple components provided on the power circuit board, there exit components that are sensitive to heat. Therefore, there occurs a problem that heat-sensitive components are thermally affected and then malfunction when the power circuit board generates a large amount of heat.

It is therefore an object of the present invention to provide a motor driving device that prevents components provided on a power circuit board from malfunctioning due to heat generation of the power circuit board.

According to an aspect of the present invention, a motor driving device includes: a control circuit board provided with a control circuit configured to output a control signal of a secondary voltage; and a power circuit board provided with power circuitry to which a primary voltage higher than the secondary voltage is applied. The power circuit board includes: a first substrate provided with a primary voltage component group to which only the primary voltage is applied; and a second substrate provided with a converter component group configured to convert the primary voltage into the secondary voltage and convert the secondary voltage into the primary voltage.

According to the present invention, it is possible to prevent the converter component group of the power circuitry from malfunctioning due to generation of heat in the primary voltage component group of the power circuitry.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWING

FIG. 1 is a side view showing an example of a schematic configuration of a motor driving device according to an embodiment.

DESCRIPTION OF THE PREFERRED EMBODIMENTS

A motor driving device according to the present invention will be detailed below by describing a preferred embodiment with reference to the accompanying drawings.

FIG. 1 is a side view showing an example of a schematic configuration of a motor driving device 10 according to the embodiment. In the following description, the upward and downward directions will be described based on the directions of the arrows shown in FIG. 1. The motor driving device 10 for driving a motor includes a control circuit board 12 and a power circuit board 14.

The control circuit board 12 has, mounted thereon, a control circuit 20 that outputs signals of a secondary voltage (e.g., 24 V). The control circuit 20 has, for example, an IC (Integrated Circuit) or the like. The power circuit board 14 has, mounted thereon, power circuitry 22 to which a primary voltage (e.g., 100 V or higher) higher than the secondary voltage is applied.

The power circuitry 22 is a power transmission system including a rectifier for rectifying AC (alternating-current) voltage supplied from an AC power supply into DC (direct-current) voltage, a capacitor for smoothing the rectified DC voltage, an inverter for converting the DC voltage smoothed by the capacitor into AC voltage to thereby drive a motor, and other components. The control circuit 20 is a control system for controlling the switching elements of the inverter and performs predetermined operations and others.

The control circuit board 12 is arranged above the power circuit board 14. In the present embodiment, the control circuit board 12 and the power circuit board 14 are arranged so that a surface of the control circuit board 12 on which the control circuit 20 is provided and a surface of the power circuit board 14 on which the power circuitry 22 is provided intersect with each other.

The power circuit board 14 has a first substrate 14a and a second substrate 14b. The power circuitry 22 includes a primary voltage component group 22a and a power device 22c, which are mounted on the first substrate 14a, and further includes a converter component group 22b mounted on the second substrate 14b.

The converter component group 22b converts the primary voltage into the secondary voltage and the secondary voltage into the primary voltage. For example, the converter component group 22b is formed of a photo coupler, optical isolator, transformer, A/D converter, etc. For example, the converter component group 22b converts control signals of the secondary voltage output from the control circuit 20 into control signals of the primary voltage. The converter component group 22b converts detection signals of the primary voltage output from the power circuitry 22 into detection signals of the secondary voltage. In addition to the converter component group 22b, components whose heat generation amount is less than a predetermined level may be provided on the second substrate 14b. Examples of the components whose heat generation amount is less than the predetermined level may include components for performing signal processing before conversion by the converter component group 22b and components for performing signal processing after the conversion.

The primary voltage component group 22*a* and the power device 22*c* are heat-generating components to which only the primary voltage is applied and which generate an amount of heat greater than a predetermined level. The power device 22*c* is a power semiconductor device such as an insulated gate bipolar transistor (IGBT) or a power transistor (power MOSFET). The IGBT, the power MOSFET and the like are switching elements driven by control signals output from the control circuit 20.

The primary voltage component group 22*a* includes components to which only the primary voltage is applied, other than the power device 22*c*. The primary voltage component group 22*a* includes, for example, a first conductor 23*a* transmitting a control signal of the primary voltage converted by the converter component group 22*b* to the power device 22*c*, a second conductor 23*b* transmitting a detection signal of the primary voltage to the converter component group 22*b*, and a third conductor 23*c* through which a greater amount of current than a predetermined level flows and is supplied to the motor to thereby drive it. The detection signal of the primary voltage is a signal indicating a voltage or a current applied to the rectifier or the inverter. The detection signal of the primary voltage is, for example, a signal detected using a current sensor, a current detection resistor or a voltage detection resistor. The current sensor, the current detection resistor and the voltage detection resistor are also included in the primary voltage component group 22*a*.

The first substrate 14*a* and the second substrate 14*b* are arranged so that the surfaces on which the components are mounted are parallel to each other. The second substrate 14*b* is arranged above the first substrate 14*a*. The primary voltage component group 22*a* is provided on the upper surface (one surface) PA1 side of the first substrate 14*a*. The converter component group 22*b* is provided on the upper surface (one surface) PB1 side of the second substrate 14*b*. Therefore, the primary voltage component group 22*a* is provided between the upper surface PA1 of the first substrate 14*a* and the lower surface (another surface) PB2 of the second substrate 14*b*. The power device 22*c* is provided on the lower surface (another surface) PA2 side of the first substrate 14*a*.

Thus, in the power circuitry 22, the primary voltage component group 22*a* and the power device 22*c* that generate a large amount of heat, and the converter component group 22*b* that will malfunction due to heat generated in the primary voltage component group 22*a* and the power device 22*c*, are arranged in separate substrates, so that it is possible to prevent the converter component group 22*b* from malfunctioning.

The control circuit board 12 is arranged above the second substrate 14*b* so that the upper surface PB1 of the second substrate 14*b* on which the components are mounted and the surface of the control circuit board 12 on which the control circuit 20 is mounted intersect with each other.

A heat sink 24 is a heat dissipation component for cooling the primary voltage component group 22*a* and the power device 22*c* (particularly, the power device 22*c*) which generate a large amount of heat, and is arranged under the power device 22*c*.

A fan 26 blows air to the primary voltage component group 22*a* and the power device 22*c* which generate a large amount of heat, so as to cool the primary voltage component group 22*a* and the power device 22*c*. The fan 26 is arranged so as to blow air to the primary voltage component group 22*a* and the power device 22*c* and so as not to blow air to the control circuit 20 or the converter component group 22*b*.

For example, the fan 26 may be disposed below the upper surface PB1 of the second substrate 14*b* and may be arranged so as to send air toward the primary voltage component group 22*a* and the power device 22*c* from a direction intersecting the vertical direction.

Incidentally, a mist of liquid such as cutting fluid is drifting in the ambient air around a machine tool or the like in which the motor driving device 10 is installed. There is a risk that the control circuit 20 and the converter component group 22*b* malfunction when a liquid mist such as a cutting fluid adheres thereto. Therefore, in the embodiment, the fan 26 is arranged so that air will not be blown to the control circuit 20 and the converter component group 22*b*. Thus, it is possible to cool the primary voltage component group 22*a* while preventing the control circuit 20 and the converter component group 22*b* from malfunctioning due to the liquid (e.g., cutting fluid) contained in the blown air.

A shielding member 28 for blocking flow of air blown from the fan 26 may be provided so that the air blown from the fan 26 will not flow toward the control circuit 20 and the converter component group 22*b*. Provision of the shielding member 28 makes it possible to efficiently cool the primary voltage component group 22*a* and the power device 22*c* while reliably preventing malfunction of the control circuit 20 and the converter component group 22*b*.

Though the shielding member 28 for preventing the blown air from the fan 26 from flowing toward the control circuit 20 and the converter component group 22*b* is provided as a separate member, a member or a component provided in the motor driving device 10 may be used as the shielding member 28. For example, the second substrate 14*b* may be used as the shielding member 28, or the housing or the like of the motor driving device 10 may be used as the shielding member 28. For example, by extending the second substrate 14*b* up to the fan 26, the second substrate 14*b* can be used as the shielding member 28. Alternatively, by arranging the fan 26 close to the second substrate 14*b*, the second substrate 14*b* can be used as the shielding member 28.

Next, signal flow in the motor driving device 10 will be briefly described. The control signal of the secondary voltage output from the control circuit 20 is converted into a control signal of the primary voltage by the converter component group 22*b*. The control signal of the primary voltage is input to the power device 22*c* via the first conductor 23*a*. Thereby, the power device 22*c* as a switching element is turned on and off, whereby electric current flows through the third conductor 23*c* so as to drive the motor. Detection signals of the primary voltage indicating the current supplied to the motor and the voltage applied to the motor are input to the converter component group 22*b* via the second conductor 23*b*. The converter component group 22*b* converts the detection signal of the primary voltage into a detection signal of the secondary voltage and outputs it to the control circuit 20. As a result, the control circuit 20 can recognize the current and the voltage applied to the motor, and can perform feedback-control on the motor based on these detection signals.

FIG. 1 illustrates a configuration in which the primary voltage component group 22*a* mounted on the first substrate 14*a* is put in contact with the lower surface PB2 of the second substrate 14*b*, but the first substrate 14*a* and the second substrate 14*b* may be arranged so that the primary voltage component group 22*a* and the lower surface PB2 of the second substrate 14*b* are spaced from each other.

In FIG. 1, the power device 22*c* is disposed on the lower surface PA2 of the first substrate 14*a*, but may be disposed on the upper surface PA1 of the first substrate 14a. Further, part of the primary voltage component group 22a may be disposed on the lower surface PA2 side of the first substrate 14a.

Technical Ideas Obtained from Embodiment

Technical ideas that can be grasped from the above embodiment will be described below.

The motor driving device (10) includes a control circuit board (12) provided with a control circuit (20) configured to output a control signal of a secondary voltage and a power circuit board (14) provided with power circuitry (22) to which a primary voltage higher than the secondary voltage is applied. The power circuit board (14) includes a first substrate (14a) provided with a primary voltage component group (22a) to which only the primary voltage is applied, and a second substrate (14b) provided with a converter component group (22b) configured to convert the primary voltage into the secondary voltage and convert the secondary voltage into the primary voltage.

Thus, the substrate on which the converter component group (22b) making up a part of the power circuitry (22) is provided and the substrate on which the primary voltage component group (22a) making up another part of the power circuitry (22) is provided are separated from each other, so that it is possible to prevent the converter component group (22b) from malfunctioning due to heat generation of the primary voltage component group (22a).

The first substrate (14a) may be provided with a power device (22c) driven by the control signal while the converter component group (22b) may be configured to convert the control signal of the secondary voltage into a control signal of the primary voltage. The primary voltage component group (22a) may include a first conductor (23a) configured to transmit the control signal of the primary voltage to the power device (22c). Thus, since the power device (22c) is provided on the first substrate (14a), it is possible to prevent the converter component group (22b) from malfunctioning due to heat generation of the power device (22c), so that the power device (22c) can be normally driven.

The primary voltage component group (22a) may include a second conductor (23b) configured to transmit a detection signal of the primary voltage to the converter component group (22b), and the converter component group (22b) may be configured to convert the detection signal of the primary voltage into the detection signal of the secondary voltage and output the detection signal to the control circuit (20). This makes it possible to prevent the converter component group (22b) from malfunctioning due to heat generation of the primary voltage component group (22a) and output a normal detection signal to the control circuit (20).

The primary voltage component group (22a) may include a third conductor (23c) through which an amount of electric current greater than a predetermined level flows. Since the third conductor (23c) through which a large current flows is also provided on the first substrate (14a), it is possible to prevent the converter component group (22b) from malfunctioning.

The primary voltage component group (22a) may be provided on one surface (PA1) side of the first substrate (14a) while the second substrate (14b) may be arranged on an opposite side of the primary voltage component group (22a) from the first substrate (14a). The converter component group (22b) may be provided on an opposite side (PB1) of the second substrate (14b) from the primary voltage component group (22a).

The motor driving device (10) may further include a fan (26) arranged so as to blow air to the primary voltage component group (22a) and no air toward the control circuit (20) or the converter component group (22b). Thereby, it is possible to cool the primary voltage component group (22a) while preventing the control circuit (20) and the converter component group (22b) from malfunctioning due to liquid (e.g., cutting fluid) contained in the blown air.

The motor driving device (10) may further include a shielding member (28) configured to block flow of air blown from the fan (26) so that no air flows toward the control circuit (20) or the converter component group (22b). Thereby, it is possible to efficiently cool the primary voltage component group (22a) and the power device (22c), and it is possible to reliably prevent malfunction of the control circuit (20) and the converter component group (22b).

While the invention has been particularly shown and described with reference to the preferred embodiments, it will be understood that variations and modifications can be effected thereto by those skilled in the art without departing from the scope of the invention as defined by the appended claims.

What is claimed is:

1. A motor driving device, comprising:
   a control circuit board provided with a control circuit configured to output a control signal of a secondary voltage; and
   a power circuit board provided with power circuitry to which a primary voltage higher than the secondary voltage is applied, wherein the power circuit board includes:
   a first substrate provided with a primary voltage component group to which only the primary voltage is applied; and
   a second substrate provided with a converter component group configured to convert the primary voltage into the secondary voltage and convert the secondary voltage into the primary voltage, wherein:
   the primary voltage component group is provided on one surface side of the first substrate;
   the second substrate is arranged on an opposite side of the primary voltage component group from the first substrate; and
   the converter component group is provided on an opposite side of the second substrate from the primary voltage component group.

2. The motor driving device according to claim 1, wherein:
   the first substrate is provided with a power device driven by the control signal;
   the converter component group is configured to convert the control signal of the secondary voltage into a control signal of the primary voltage; and
   the primary voltage component group includes a first conductor configured to transmit the control signal of the primary voltage to the power device.

3. The motor driving device according to claim 1, wherein:
   the primary voltage component group includes a second conductor configured to transmit a detection signal of the primary voltage to the converter component group; and
   the converter component group is configured to convert the detection signal of the primary voltage into a detection signal of the secondary voltage and output the detection signal to the control circuit.

4. The motor driving device according to claim 1, wherein the primary voltage component group includes a third conductor through which an amount of electric current greater than a predetermined level flows.

5. A motor driving device, comprising:
- a control circuit board provided with a control circuit configured to output a control signal of a secondary voltage; and
- a power circuit board provided with power circuitry to which a primary voltage higher than the secondary voltage is applied, wherein the power circuit board includes:
- a first substrate provided with a primary voltage component group to which only the primary voltage is applied; and
- a second substrate provided with a converter component group configured to convert the primary voltage into the secondary voltage and convert the secondary voltage into the primary voltage, further comprising a fan arranged so as to blow air to the primary voltage component group and no air toward the control circuit or the converter component group.

6. The motor driving device according to claim 5, further comprising a shielding member configured to block flow of air blown from the fan so that no air flows toward the control circuit or the converter component group.

7. The motor driving device according to claim 5, wherein:
- the first substrate is provided with a power device driven by the control signal;
- the converter component group is configured to convert the control signal of the secondary voltage into a control signal of the primary voltage; and
- the primary voltage component group includes a first conductor configured to transmit the control signal of the primary voltage to the power device.

8. The motor driving device according to claim 5, wherein:
- the primary voltage component group includes a second conductor configured to transmit a detection signal of the primary voltage to the converter component group; and
- the converter component group is configured to convert the detection signal of the primary voltage into a detection signal of the secondary voltage and output the detection signal to the control circuit.

9. The motor driving device according to claim 5, wherein the primary voltage component group includes a third conductor through which an amount of electric current greater than a predetermined level flows.

* * * * *